United States Patent
Kazama et al.

(10) Patent No.: US 7,815,438 B2
(45) Date of Patent: Oct. 19, 2010

(54) NEEDLE-LIKE MEMBER, CONDUCTIVE CONTACT, AND CONDUCTIVE CONTACT UNIT

(75) Inventors: Toshio Kazama, Nagano (JP); Kohei Hironaka, Nagano (JP)

(73) Assignee: NHK Spring Co., Ltd., Yokohama-Shi, Kanagawa (JP)

( * ) Notice: Subject to any disclaimer, the term of this patent is extended or adjusted under 35 U.S.C. 154(b) by 0 days.

(21) Appl. No.: 10/588,311

(22) PCT Filed: Feb. 4, 2005

(86) PCT No.: PCT/JP2005/001712

§ 371 (c)(1),
(2), (4) Date: Aug. 3, 2006

(87) PCT Pub. No.: WO2005/076018

PCT Pub. Date: Aug. 18, 2005

(65) Prior Publication Data

US 2007/0128906 A1 Jun. 7, 2007

(30) Foreign Application Priority Data

Feb. 4, 2004 (JP) ............................... 2004-028106

(51) Int. Cl.
*H01R 12/00* (2006.01)
(52) U.S. Cl. ...................................................... 439/66
(58) Field of Classification Search .................. 439/66, 439/700, 822, 824; 324/758, 761
See application file for complete search history.

(56) References Cited

U.S. PATENT DOCUMENTS

| 5,414,369 | A | | 5/1995 | Kazama | |
| 5,746,606 | A | * | 5/1998 | Sobhani | 439/21 |
| 6,220,870 | B1 | * | 4/2001 | Barabi et al. | 439/71 |
| 6,396,293 | B1 | * | 5/2002 | Vinther et al. | 324/761 |
| 6,861,862 | B1 | * | 3/2005 | Tate | 324/761 |
| 6,992,496 | B2 | * | 1/2006 | Winter et al. | 324/755 |

(Continued)

FOREIGN PATENT DOCUMENTS

EP 1 510 827 A1 3/2005

(Continued)

OTHER PUBLICATIONS

Official Action for Korean Application No. 10-2006-7015527, mailed Feb. 12, 2008.

(Continued)

*Primary Examiner*—Alexander Gilman
(74) *Attorney, Agent, or Firm*—Edwards Angell Palmer & Dodge LLP

(57) ABSTRACT

A first needle-like member includes a columnar member formed by a conductive material such as a metal material with its up-and-down direction being longitudinal, and a contact member formed on a semiconductor integrated circuit (body to be contacted) side with respect to the columnar member, which are integrally formed. In the columnar member, a through hole is formed in the longitudinal direction of the first needle-like member. The through hole has opening ends on both sides thereof. Thus, in the process of manufacturing the needle-like member, the contact member is formed on a rod-like body being a raw material from the same direction as a drill insertion direction to form the through hole.

15 Claims, 9 Drawing Sheets

U.S. PATENT DOCUMENTS 7,049,838 B2 * 5/2006 Kagami ..................... 324/754

FOREIGN PATENT DOCUMENTS

| JP | 5-180870 | 7/1993 |
| JP | 6-201725 | 7/1994 |
| JP | 7-43688 | 9/1995 |
| JP | 2000-241447 | 9/2000 |
| JP | 2001-091538 | 4/2001 |
| JP | 2003-344450 | 12/2003 |
| KR | 182523 | 5/2000 |
| WO | WO-03/087853 | 10/2003 |

OTHER PUBLICATIONS

Japanese Office Action mailed Apr. 20, 2010 issued in Japanese Patent Application No. 2004-028106.

Japanese Office Action mailed Aug. 18, 2009 issued in Japanese Patent Application No. 2004-028106.

Office Action for Korean Application No. 10-2006-7015527, mailed Aug. 6, 2007.

* cited by examiner

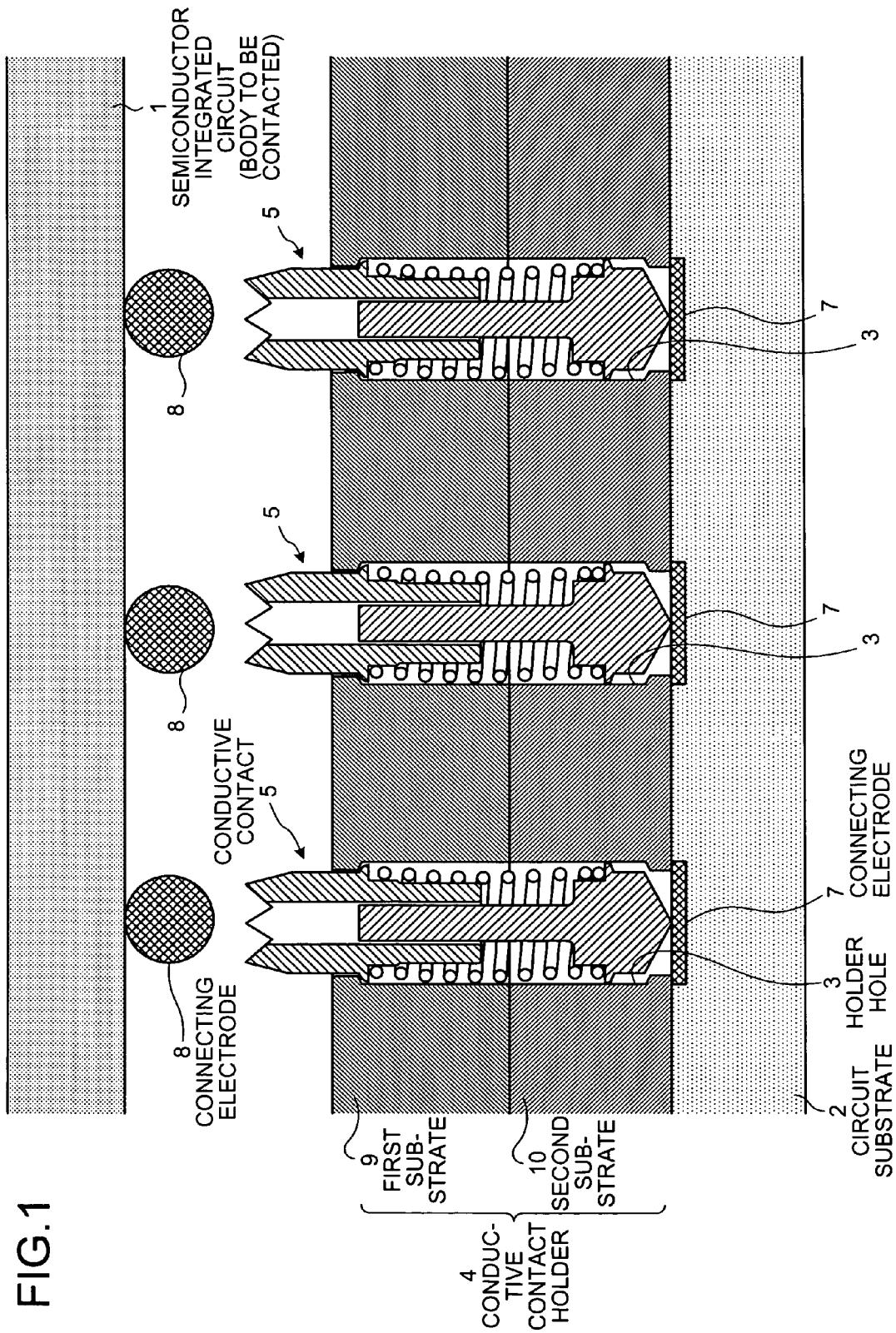

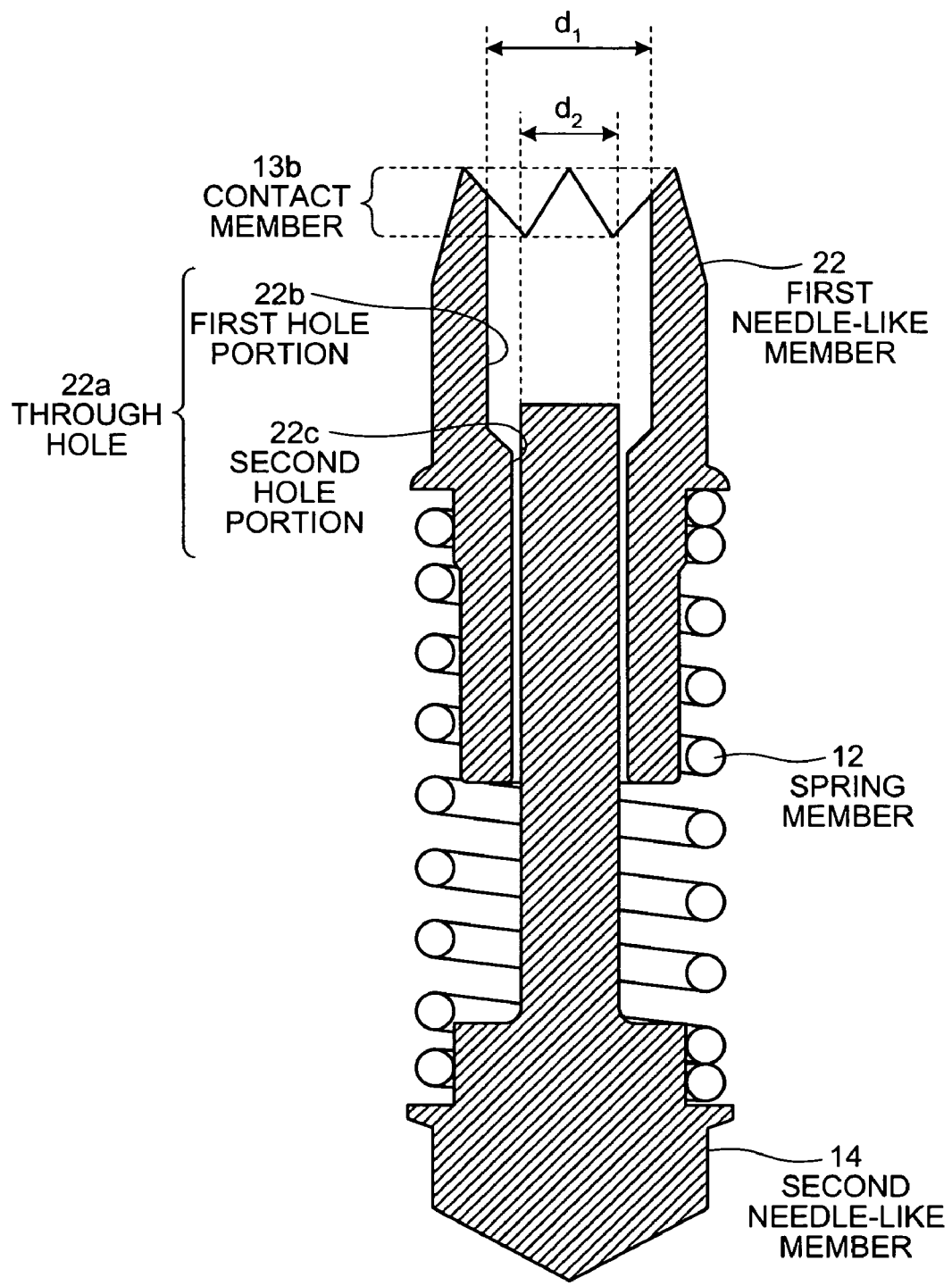

NEEDLE-LIKE MEMBER, CONDUCTIVE CONTACT, AND CONDUCTIVE CONTACT UNIT

FIELD OF THE INVENTION

The present invention relates to a technique for electrically connecting a to-be-contacted body to a circuit board that includes a circuit for generating an electrical signal to be supplied to the to-be-contacted body.

DESCRIPTION OF THE RELATED ART

In a technical field related to electrical characteristic inspection for semiconductor integrated circuits, a technique has been known which concerns a conductive contact unit including a plurality of conductive contacts arranged correspondingly to external connection electrodes of a semiconductor integrated circuit. Such a conductive contact unit includes a plurality of conductive contacts, a conductive contact holder with openings for accommodating the conductive contacts, and an inspection circuit electrically connected to the conductive contact. To electrically connect a plurality of external connection electrodes to the inspection circuit while absorbing convex and concave shapes present between the external connection electrodes in a semiconductor integrated circuit, the conductive contact needs to be contractible and extendable.

FIG. 8 is a schematic of a configuration of a conventional conductive contact constituting a conductive contact unit. As shown in FIG. 8, the conventional conductive contact includes a plunger 101 and a barrel 102 made of a conductive material, and a spring 103 arranged between the plunger 101 and the barrel 102. The plunger 101 includes a contact member 105 for electrically connecting to one of an external connection electrode of a semiconductor integrated circuit and an inspection circuit, a columnar member 106 arranged downward of the contact member 105, and a support member 107 arranged downward of the columnar member 106, which are integrally formed. The barrel 102 includes a contact member 108 for electrically connecting to the other of the external connection electrode and the inspection circuit and a columnar member 109 arranged upward of the contact member 108 which are integrally formed, and a hollow portion 110 for accommodating the support member 107 in the plunger 101.

The conductive contact shown in FIG. 8 is formed so that an outer diameter of the support member 107 and an inner diameter of the hollow portion 110 are almost the same, and the plunger 101 has a structure in which the support member 107 is vertically movable with respect to the barrel 102 while being guided by an inner wall of the hollow portion 110. Additionally, in the conductive contact shown in FIG. 8, the spring 103 is arranged between the plunger 101 and the barrel 102. Consequently, the plunger 101 and the barrel 102 are elastically biased by the spring 103 to be in elastic contact with the inspection circuit or the external connection electrode of the semiconductor integrated circuit, and electrically connects between the semiconductor integrated circuit and the inspection circuit (for example, refer to Patent Document 1).

Patent Document 1: Japanese Patent Application Laid-Open No. 2000-241447 (FIG. 2)

SUMMARY OF THE INVENTION

However, the conventional conductive contact shown in FIG. 8 has problems in that it is not easy to manufacture, especially the barrel 102, and difficult to reduce manufacturing cost. The problems will be described in detail below.

When being combined with the plunger 101, the barrel 102 has to be configured such that an opening end of the hollow portion 110 is formed at the end of the plunger 101 side, and the contact member 108 is formed at an end opposite to the plunger 101. That is, the hollow portion 110 guides the movement of the plunger 101 by accommodating the support member 107 of the plunger 101, and is required to be able to accommodate the support member 107. Accordingly, the opening end of the hollow portion 110 needs to be formed on the plunger 101 side. Whereas, the contact member 108 is provided to come in contact with the semiconductor integrated circuit or the inspection circuit, and needs to be formed at an end of the entire conductive contact. Therefore, the contact member 108 is required to be formed on the side opposite to the plunger 101, i.e., on the side opposite to the opening end of the hollow portion 110.

On the other hand, machinery such as a lathe or the like can generally be processed from only one direction with respect to a metal member. Therefore, in the case of manufacturing the barrel 102, first, a rod-like member to be processed made of, for example, a metal material is fixed in a state where a part at which the contact member 108 is to be formed faces a processing member, and then the contact member 108 is formed. The rod-like body is once released from the fixed state after the completion of forming the contact member 108, and is fixed again in a state where a part at which an opening end is to be formed (i.e., the side opposite to the part where the contact member 108 is to be formed) faces the processing member, and then the hollow portion 110 is formed. As described above, in the case of manufacturing the barrel 102 by general machinery, it is required to change the direction of the member to be processed and fix it again in the process of manufacturing, which complicates the manufacturing process.

In addition, the member to be processed needs to be once released from the fixed state to change direction, which causes axis deviation of the barrel 102 to be formed. In other words, as shown in FIG. 8, the barrel 102 has a rotational symmetry shape, theoretically, with respect to its longitudinal direction as an axis. A holder or the like for accommodating the plunger 101, the spring 103, and the conductive contact is designed based on such a shape. Consequently, when the manufacturing process is performed while the central axis of the hollow portion 110 and the contact member 108 is deviated from the designed one, trouble is caused in extension and contraction movement as the entire conductive contact, and also, sufficient electrical contact cannot be achieved with the inspection circuit or the like. Therefore, when the barrel 102 is manufactured by general machinery, accurate axis alignment is required for refixing the member to be processed, which necessitates complication in the manufacturing process.

It is possible to solve the problems by using machinery capable of processing the rod-like member to be processed not only from one direction but from both directions. However, such machinery is generally not available commercially, and special machinery is required to manufacture the barrel 102. This is not preferable from the view point of manufacturing cost.

It is therefore an object of the present invention to provide a needle-like member such as a barrel having a structure that facilitates the manufacturing process, a conductive contact and a conductive contact unit incorporating the needle-like member.

To solve the problems described above, a needle-like member forming a conductive contact which electrically connects a to-be-contacted body to a circuit for generating and transmitting an electrical signal to be supplied to the to-be-contacted body or to a circuit board including the circuit, includes a contact member in which a portion coming in contact with the to-be-contacted body during use is processed into a predetermined shape, and a columnar member that is integrally formed with the contact member, and is formed with a through hole having a constant inner diameter or an inner diameter monotonically decreasing with distance from the contact member.

The through hole formed in the needle-like member is penetrated. Therefore, in the process of manufacturing the needle-like member, the contact member and the through hole can be formed from the same direction. Thus, it is possible to realize a needle-like member which can be manufactured in a simple manner.

In the needle-like member, the contact member may be formed near a peripheral portion of the columnar member in a longitudinal direction to come in contact with a peripheral portion of a connecting electrode of the to-be-contacted body during use.

A conductive contact which electrically connects a to-be-contacted body to a circuit for generating and transmitting an electrical signal to be supplied to the to-be-contacted body or to a circuit board including the circuit, includes a first needle-like member including a contact member that comes in contact with one of the to-be-contacted body, and the circuit or the circuit board during use, and in which a portion coming in contact with the to-be-contacted body is processed into a predetermined shape, and a columnar member that is integrally formed with the contact member, and is formed with a through hole having a constant inner diameter or an inner diameter monotonically decreasing with distance from the contact member, a second needle-like member that is arranged to be electrically connected to the first needle-like member, and slides in a longitudinal direction relative to the first needle-like member, and a spring member that is joined to the first needle-like member and the second needle-like member, and applies an elastic force corresponding to a distance between the first needle-like member and the second needle-like member.

In the conductive contact, the second needle-like member includes a support member that is slidable in the longitudinal direction while being in contact with an inner circumference surface of the through hole formed in the first needle-like member, and a contact member that is integrally formed with the support member, and comes in electrical contact with the other of the to-be-contacted body, and the circuit or the circuit board during use.

A conductive contact unit includes a circuit that generates and transmits an electrical signal to be supplied to a to-be-contacted body or a circuit board that includes the circuit, a conductive contact including a needle-like member with a contact member that comes in contact with one of the to-be-contacted body, and the circuit or the circuit board including the circuit during use, in which a portion coming in contact with the to-be-contacted body is processed into a predetermined shape, and a columnar member that is integrally formed with the contact member, and is formed with a through hole having a constant inner diameter or an inner diameter monotonically decreasing with distance from the contact member, and a spring member that biases the needle-like member in a direction perpendicular to the to-be-contacted body, and a conductive contact holder that includes a holder hole for accommodating the conductive contact.

In the needle-like member, the conductive contact, and the conductive contact unit according to the present invention, the through hole formed in the needle-like member is penetrated. Therefore, in the process of manufacturing the needle-like member, the contact member and the through hole can be formed from the same direction. Thus, it is possible to realize a needle-like member which can be manufactured in a simple manner. Furthermore, because the processing direction of the contact member conforms to the forming direction of the through hole, it is possible to process the contact member and form the through hole while the fixing state is maintained through the manufacturing process. Thus, a high-quality needle-like member which prevents axis deviation can be manufactured.

BRIEF DESCRIPTION OF DRAWINGS

FIG. 1 is a sectional view of the entire configuration of a conductive contact unit according to an embodiment of the present embodiment.

FIG. 3-1 is a schematic for explaining a manufacturing process of a first needle-like member constituting a conductive contact.

FIG. 3-2 is a schematic for explaining the manufacturing process of the first needle-like member constituting the conductive contact.

FIG. 3-3 is a schematic for explaining the manufacturing process of the first needle-like member constituting the conductive contact.

FIG. 3-4 is a schematic for explaining the manufacturing process of the first needle-like member constituting the conductive contact.

FIG. 3-5 is a schematic for explaining the manufacturing process of the first needle-like member constituting the conductive contact.

FIG. 4 is a sectional view of a configuration of a conductive contact constituting a conductive contact unit according to a first modified example.

FIG. 5-1 is a schematic for explaining a manufacturing process of a needle-like member constituting the conductive contact in the first modified example.

FIG. 5-2 is a schematic for explaining the manufacturing process of the needle-like member constituting the conductive contact in the first modified example.

FIG. 6-1 is a schematic of the conductive contact being extended in the first modified example.

FIG. 6-2 is a schematic of the conductive contact being contracted in the first modified example.

Figure 2:
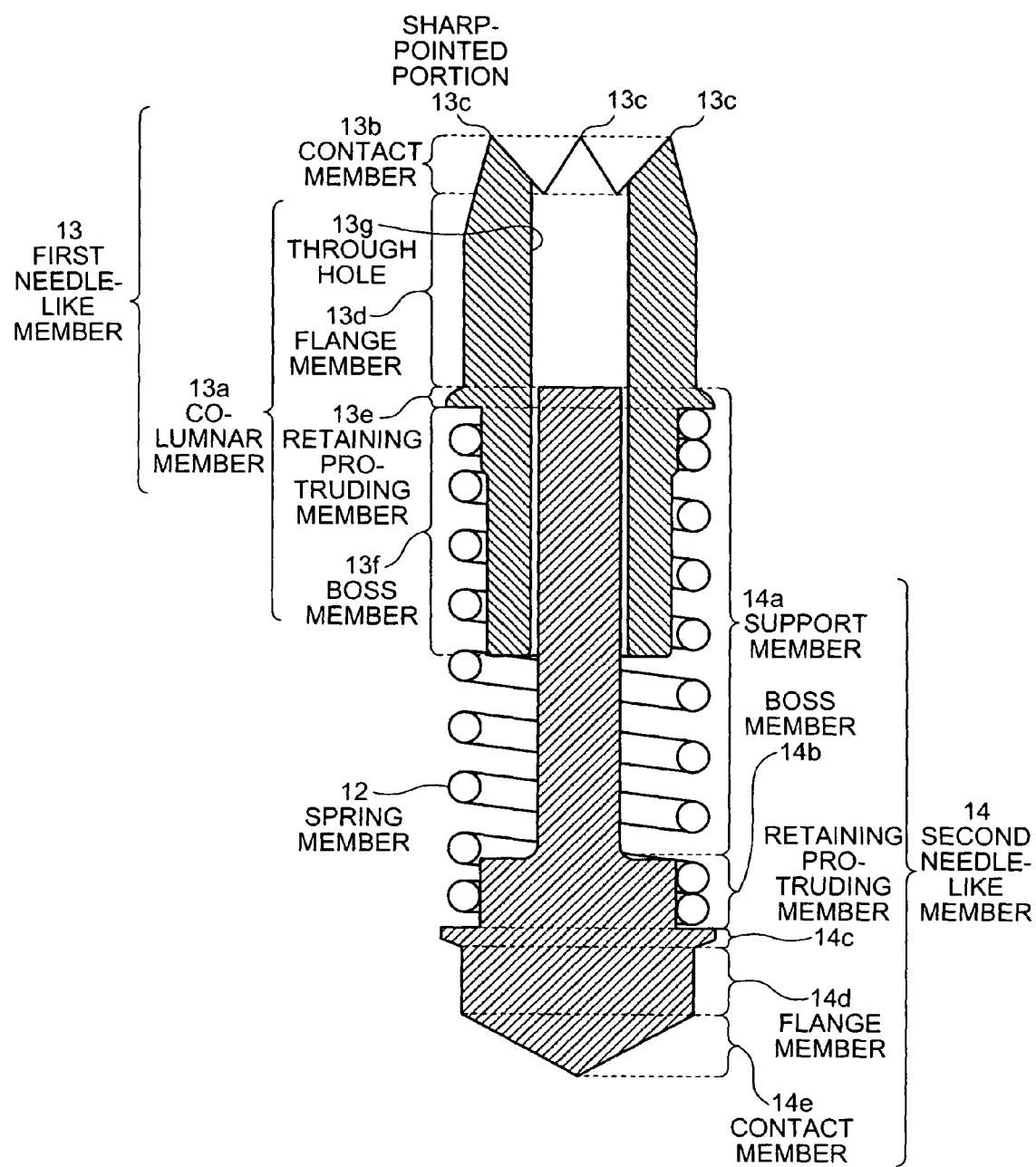
FIG. 2 is a schematic of a configuration of the conductive contact constituting according to the embodiment.

EXPLANATIONS OF LETTERS OR NUMERALS 1 semiconductor integrated circuit
2 circuit board
3 holder hole
4 conductive contact holder
5 conductive contact
7 connecting electrode
8 connecting electrode
9 first substrate
10 second substrate 12 spring member
13 first needle-like member
13a columnar member
13b contact member
13c sharp-pointed portion
13d flange member
13e retaining protruding member
13f boss member
13g through hole
14 second needle-like member
14a support member
14b boss member
14c retaining protruding member
14d flange member
14e contact member
16 rod-like body
17 gripping member
18 grinding member
19 hole portion
20 drill
21 grinding member
22 first needle-like member
22a through hole
22b first hole portion
22c second hole portion
24 rod-like body
25 gripping member
26 small bore drill
27 hole portion
28 large bore drill
29 hole portion
30 needle-like member
30a contact member
101 plunger
102 barrel
103 spring
105 contact member
106 columnar member
107 support member
108 contact member
109 columnar member
110 hollow portion

DETAILED DESCRIPTION OF AN EXEMPLARY EMBODIMENT

An exemplary embodiment of a needle-like member, a conductive contact, and a conductive contact unit according to the present invention will be described in detail below with reference to the drawings. Incidentally, the drawings are schematic only; note that relationship between thicknesses and widths of respective portions, proportion of thicknesses of respective portions, and the like are different from the actual ones. Naturally, relationship and proportion of sizes of respective portions vary among the drawings.

Figures 1, 3:
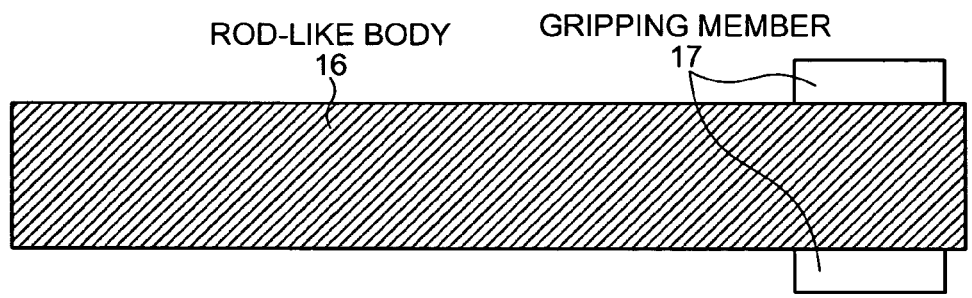
Figures 2, 3:
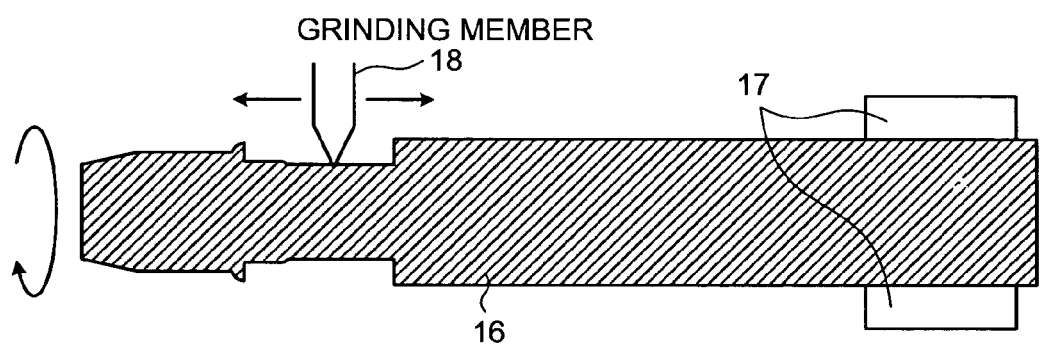
Figure 3:
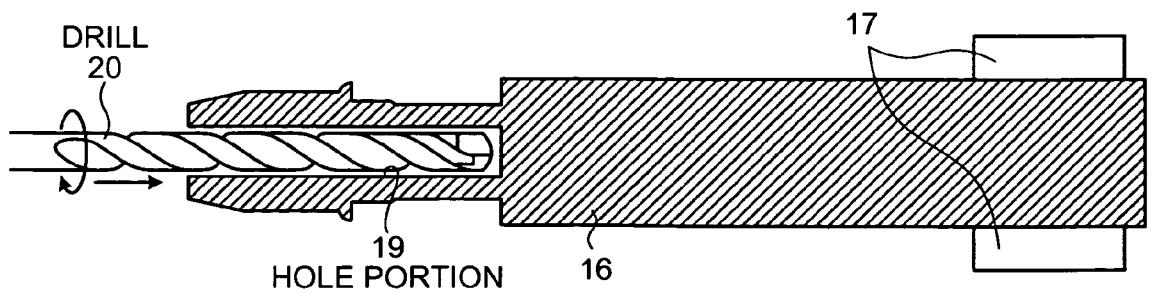

FIG. 1 is a sectional view of the entire configuration of a conductive contact unit according to an exemplary embodiment of the present invention. The conductive contact unit according to the exemplary embodiment includes a circuit board 2 with a circuit which generates a signal to be supplied to a semiconductor integrated circuit 1, a conductive contact holder 4 arranged on the circuit board 2 where a holder hole 3 is formed, and a conductive contact 5 accommodated in the holder hole 3.

The circuit board 2 includes an inspection circuit for inspecting electrical characteristics of the semiconductor integrated circuit 1 which is an inspection object. Specifically, the circuit formed on the circuit board 2 has a function to generate and transmit electrical signals for inspection. Furthermore, on a surface of the semiconductor integrated circuit 1 to contact the conductive contact holder 4, a connecting electrode 8 is arranged for electrically connecting the built-in inspection circuit to the conductive contact 5.

The conductive contact holder 4 accommodates the conductive contact 5. Specifically, the conductive contact holder 4 includes a first substrate 9 and a second substrate 10 formed by an insulating material that are bonded together, through which the holder hole 3 passes.

The holder holes 3 have a columnar shape, and are formed to penetrate the conductive contact holder 4 correspondingly to an arrangement pattern of a plurality of the connecting electrodes 8 on the semiconductor integrated circuit 1 to be inspected. The holder holes 3 functions as a positioning unit and a guide unit for accommodating the conductive contact 5. The holder hole 3 is formed by applying etching, punching, or a laser beam, electron beam, ion beam, wire electric discharge, drilling, or the like to the respective first substrate 9 and the second substrate 10.

Furthermore, the holder hole 3 is formed so that the inner diameter is reduced near the upper and lower external surfaces of the conductive contact holder 4 so as to retain the conductive contact 5. That is, as to be described later, the conductive contact 5 has protruding members to be retained, and, when the conductive contact 5 extends, the protruding members are brought into contact with the narrow inner diameter of the holder hole 3 near the upper and lower surfaces of the conductive contact holder 4. The conductive contact holder 4 is formed by bonding the first substrate 9 and the second substrate 10 together to accommodate the conductive contact 5 in the holder hole 3 having the inner diameter reduced near the upper and lower external surfaces of the conductive contact holder 4 in the process of manufacturing the conductive contact unit according to the embodiment.

Next, the conductive contact 5 will be described. The conductive contact 5 electrically connects the connecting electrode 8 on the semiconductor integrated circuit 1 to a connecting electrode 7 in the circuit board 2. The conductive contact 5 is capable of expanding and contracting in a direction perpendicular to the surface of the semiconductor integrated circuit 1 to realize electrical connection while absorbing convex and concave portions generated on each of a plurality of the connecting electrodes 8.

FIG. 2 is a sectional view of a specific structure of the conductive contact 5. As shown in FIG. 2, the conductive contact 5 includes a spring member 12 formed of a coil spring or the like, and a first needle-like member 13 and a second needle-like member 14, which are arranged on both ends of the spring member 12 such that their respective tips are toward opposite directions from each other. More specifically, the first needle-like member 13 is arranged on the semiconductor integrated circuit 1 side (the upper side in FIG. 2) with respect to the spring member 12; the second needle-like member 14 is arranged on the circuit board 2 side (the lower side in FIG. 2) with respect to the spring member 12.

The first needle-like member 13 includes a columnar member 13a made of a conductive material such as a metal material with its up-and-down direction being longitudinal, and a contact member 13b formed on the semiconductor integrated circuit 1 side with respect to the columnar member 13a, which are integrally formed. Each constitutional component of the first needle-like member 13 will be described.

The contact member 13b ensures electrical conductivity between the first needle-like member 13 and the connecting electrode 8 by coming in contact with the connecting electrode 8 on the semiconductor integrated circuit 1 during use. Specifically, the contact member 13b has a plurality of sharp-pointed portions 13c in the vicinity of the peripheral portion to come in contact with a plurality of points of the connecting electrodes 8.

The contact member 13b comes in contact with the connecting electrode 8 by the sharp-pointed portions 13c, thereby ensuring electrical conductivity even when the surface is oxidized or the like. In other words, on the surface of the connecting electrode 8 made of a solder ball or the like is often formed an oxide film or the like. Therefore, in order to achieve good conductivity between the contact member 13b and the connecting electrode 8, it is necessary to form fine holes at contact points on the surface of the connecting electrode 8 coming in contact with the contact member 13b so that a conductive portion formed inside the oxide film or the like is directly brought into contact with the contact member 13b. In view of the foregoing, the contact member 13b includes the sharp-pointed portions 13c, and the fine holes are formed when the sharp-pointed portions 13c are pressed to the surface of the connecting electrode 8 to have conductivity with the inside conductive portion of the connecting electrode 8.

With the sharp-pointed portions 13c, the contact member 13b reduces electrical contact resistance between the contact member 13b and the connecting electrode 8. That is, as described above, the contact member 13b ensures conductivity with the connecting electrode 8 via the fine holes formed by the sharp-pointed portions 13c, and therefore, the contact area of one sharp-pointed portion 13c with the connecting electrode 8 is tiny. Therefore, the contact member 13b includes the sharp-pointed portions 13c to secure the contact area to some degree and reduce contact resistance. Additionally, with the sharp-pointed portions 13c, any one of the sharp-pointed portions 13c comes in contact with the connecting electrode 8 even when a position deviation occurs between the semiconductor integrated circuit 1 and the conductive contact unit according to the embodiment. Therefore, it is possible to reduce the probability of disconnection.

Further, the sharp-pointed portions 13c are arranged in the vicinity of the peripheral portion of the contact member 13b, whereby failure in mounting of the semiconductor integrated circuit 1 with the connecting electrode 8 can be prevented. In the embodiment, as described above, electrical conductivity in inspecting is ensured by forming fine holes on the surface of the connecting electrode 8 by the sharp-pointed portions 13c. When such fine holes are formed at the center of the surface of the connecting electrode 8, upon mounting the semiconductor integrated circuit 1 on a predetermined substrate after the completion of inspection, there is a possibility that a bubble or the like caused by the fine holes is generated in a joint portion formed with the connecting electrode 8 between the semiconductor integrated circuit 1 and the predetermined substrate. Such bubble or the like causes to increase a contact resistance value between the semiconductor integrated circuit 1 and the predetermined substrate, and further causes mounting failure. Therefore, in the embodiment, the sharp-pointed portions 13c are arranged in the vicinity of the peripheral portion of the contact member 13b, which prevents a fine hole from being formed near the center of the surface of the connecting electrode 8 when contacting, and further, prevents failure in the event of mounting the semiconductor integrated circuit 1.

As described above, the contact member 13b includes the sharp-pointed portions 13c to suppress adverse effect on the connecting electrode 8 and to ensure good electrical conductivity. As to be described later, a specific structure of the contact member 13b is not limited to one shown in FIG. 2; however, it is at least required to be formed in a predetermined shape according to the purpose.

Next, the columnar member 13a constituting the first needle-like member 13 will be described. The columnar member 13a includes a flange member 13d, a retaining protruding member 13e, and a boss member 13f, which are coaxially formed in this order from the semiconductor integrated circuit 1 side (the upper side in FIG. 2). The flange member 13d supports the contact member 13b. The retaining protruding member 13e prevents the first needle-like member 13 from coming off the holder hole 3 due to mutual action with the holder hole 3 in the conductive contact holder 4. The boss member 13f has a larger outer diameter near the retaining protruding member 13e, and the first needle-like member 13 is joined to the spring member 12 at the part.

The columnar member 13a further includes a through hole 13g formed in a longitudinal direction of the first needle-like member 13, that is, in the vertical direction in FIG. 2. The through hole 13g is formed to have an opening end on both the semiconductor integrated circuit 1 side and the second needle-like member 14 side with respect to the longitudinal direction of the columnar member 13a, That is, the through hole 13g is penetrated in the longitudinal direction with respect to the columnar member 13a, and is formed so that the inner diameter about an axis in the same direction as the longitudinal direction of the columnar member 13a is identical. Further, the through hole 13g is applied with plating or the like to have a smooth surface in its inner circumference surface.

The through hole 13g accommodates a support member 14a while maintaining a state where the inner circumference surface is in contact with an outer circumference surface of the support member 14a (described later) in the second needle-like member 14. As described above, the inner circumference surface of the through hole 13g is smoothed by plating or the like, and therefore, the support member 14a can move up and down in the axial direction of the through hole 13g. In other words, the through hole 13g guides the direction of relative motion between the first needle-like member 13 and the second needle-like member 14 by accommodating the support member 14a while maintaining a state where the inner circumference surface is in contact with the outer circumference surface of the support member 14a.

The inner circumference surface of the through hole 13g and the outer circumference surface of the support member 14a are formed by a conductive material, and are maintained in contact with each other so that the first needle-like member 13 is electrically connected to the second needle-like member 14. Thus, the through hole 13g has a function in which the first needle-like member 13 is electrically connected to the second needle-like member 14 by accommodating the support member 14a.

Next, the second needle-like member 14 will be described. The second needle-like member 14 includes the aforementioned support member 14a, and, on the circuit board 2 side (the lower side in FIG. 2) with respect to the support member 14a, a boss member 14b, a retaining protruding member 14c, a flange member 14d, and a contact member 14e, which are formed in this order.

The support member 14a, as described above, is accommodated in the through hole 13g in a state where the outer circumference surface is in contact with the inner circumference surface of the through hole 13g of the first needle-like member 13. Therefore, the support member 14a has an outer diameter substantially equaled to an inner diameter of the through hole 13g and, more accurately, is formed so that the outer diameter is a little smaller than the inner diameter of the through hole 13g. It is preferable that the support member 14a be smoothly movable in the vertical direction in the through hole 13g. Consequently, the outer circumference surface of the support member 14a is applied with plating or the like similarly to the inner circumference surface of the through hole 13g to be smoothed.

The boss member 14b has an outer diameter a little larger than an inner diameter of the spring member 12, and the second needle-like member 14 is joined to the spring member 12 at the boss member 14b. Similar to the retaining protruding member 13e in the first needle-like member 13, the retaining protruding member 14c prevents the second needle-like member 14 from coming off the holder hole 3 due to mutual action with the inner circumference surface of the holder hole 3. The contact member 14e electrically connects to the connecting electrode 7 in the circuit board 2, and is formed by a predetermined process with a sharp-pointed portion to be contact with the connecting electrode 7. Incidentally, it is possible to prevent the second needle-like member 14 from coming off by fixing the circuit board 2 to the conductive contact holder 4. Therefore, the retaining protruding member 14c can be omitted from the structure of the second needle-like member 14, and the shape of the contact member 14e can be in the same shape as that of the contact member 13b in the first needle-like member 13.

The spring member 12 exerts vertically elastic force on the first needle-like member 13 and the second needle-like member 14. Specifically, the spring member 12 has a predetermined spring constant. The spring member 12 is joined to the first needle-like member 13 by press-fitting one end into the boss member 13f of the first needle-like member 13, and is joined to the second needle-like member 14 by press-fitting the other end into the boss member 14b of the second needle-like member 14, thereby exerting elastic force on both the members. Incidentally, because the spring member 12 is joined to the first needle-like member 13 and the second needle-like member 14, the spring member 12 can be made of a conductive material so that the first needle-like member 13 can be electrically connected to the second needle-like member 14 via the spring member 12. However, according to the exemplary embodiment, electrical conductivity is ensured by direct contact between the inner circumference surface of the through hole 13g in the first needle-like member 13 and the outer circumference surface of the support member 14a in the second needle-like member 14. Therefore, the spring member 12 need not be made of a conductive material, and can be made of, for example, an insulating material.

Next, a manufacturing method of the first needle-like member 13 which constitutes the conductive contact 5 will be described. FIG. 3-1 to FIG. 3-5 are schematics for explaining a process for manufacturing the first needle-like member 13 using a rod-like body 16 formed by a metal material as a raw material. Description will be made below referring to FIG. 3-1 to FIG. 3-5 as required.

First, as shown in FIG. 3-1, the rod-like body 16 formed by a metal material and having a predetermined longitudinal direction is fixed by a gripping member 17. The gripping member 17 fixes the rod-like body 16, and also has a rotation mechanism (not shown in the drawing) so that a member to be gripped can rotate on a predetermined axis. As to be described later, when the first needle-like member 13 is manufactured, a process is performed while the rod-like body 16 is rotated on an axis with respect to the longitudinal direction thereof according to need. Therefore, in the embodiment, the rod-like body 16 is fixed so that a rotation axis of the gripping member 17 conforms to a central axis with respect to the longitudinal direction of the rod-like body 16.

Then, as shown in FIG. 3-2, a forming process for an outer circumference surface of the rod-like body 16 is performed while the rod-like body 16 is rotated by the gripping member 17. Specifically, the outer circumference surface of the rod-like body 16 is formed by putting a grinding member 18 in contact with the outer circumference surface of the rotating rod-like body 16 by press force according to the outer circumference shape of the first needle-like member 13. Through the forming process, the outer circumference shape of components of the first needle-like member 13: the flange member 13d, the retaining protruding member 13e, and the boss member 13f, is formed. As described above, the rod-like body 16 rotates on the central axis with respect to the longitudinal direction thereof as the rotation axis. Therefore, outer circumference portions constituting the flange member 13d, the retaining protruding member 13e, and the boss member 13f are coaxially formed through the forming process illustrated in FIG. 3-2.

After that, as shown in FIG. 3-3, a hole portion 19, in which the through hole 13g of the first needle-like member 13 is to be formed, is formed along the central axis of the rod-like body 16. Specifically, the hole portion 19 is formed by a drill 20 for forming the hole portion that is being rotated and applied with a predetermined press force to be moved to the right direction. A rotation axis of the drill 20 is previously adjusted to conform to the rotation axis of the gripping member 17. Thus, the hole portion 19 having a central axis conforming to the central axis of the rod-like body 16 is formed.

Figures 3, 4:
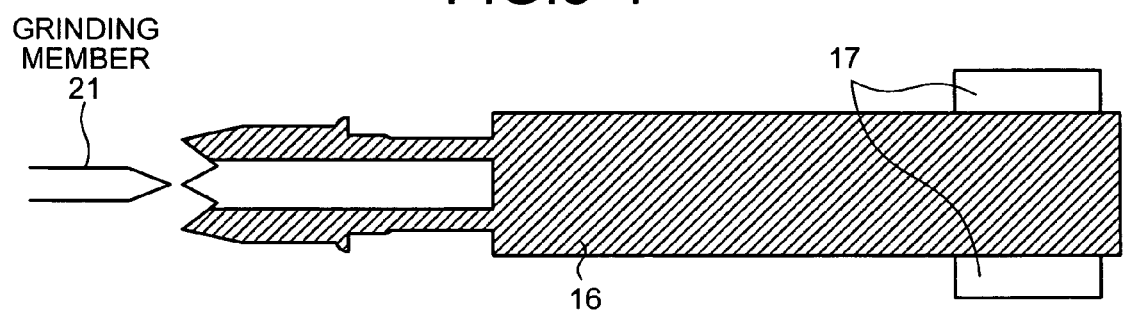

Then, as shown in FIG. 3-4, a forming process is performed by a grinding member 21 for a portion which constitutes the contact member 13b of the first needle-like member 13. When the contact member 13b has a shape shown in FIG. 2, a member capable of forming a V-shaped groove is used as the grinding member 21. After a V-shaped groove is formed by the grinding member 21 on the end surface of the rod-like body 16 to pass through the central axis of the rod-like body 16, the rod-like body 16 is rotated by 90 degrees to form another V-shaped groove. That is, the contact member 13b is formed by forming the V-shaped grooves intersecting at right angles each other on the end surface of the rod-like body 16 by the grinding member 21.

Figures 3, 4, 5:
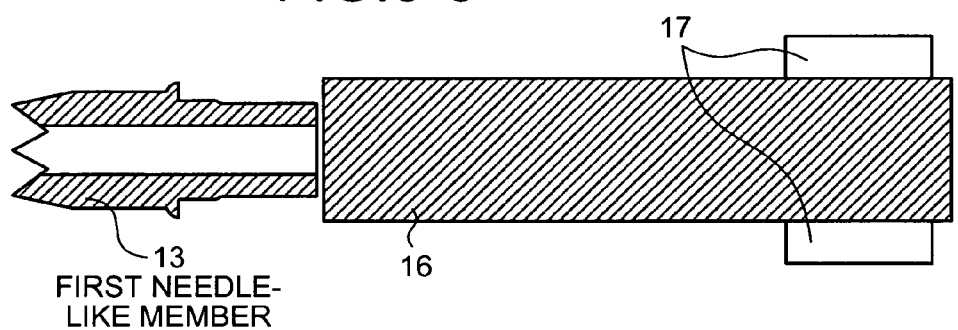
Figures 1, 5:
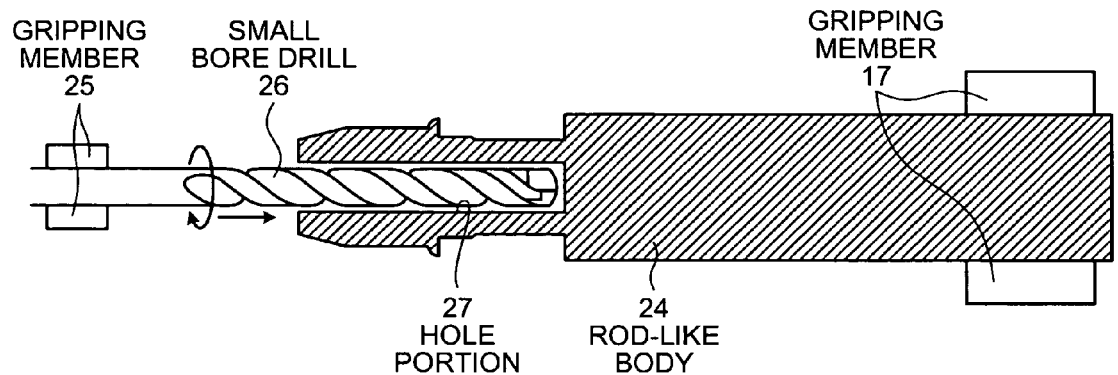
Figures 2, 5:
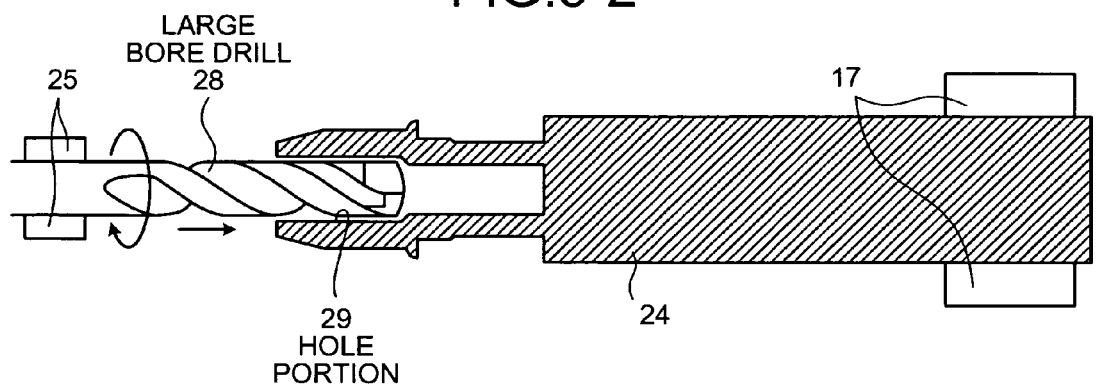

Finally, as shown in FIG. 3-5, of the rod-like body 16, the portion to which the aforementioned forming process is applied is separated, which completes the first needle-like member 13. When a large number of the first needle-like members 13 are manufactured, the rod-like body 16 is moved to the process member side (the left side in FIG. 3-5) by a predetermined distance, and then the process illustrated in FIG. 3-2 to FIG. 3-5 is repeated.

Next, advantages of the conductive contact unit according to the exemplary embodiment will be described. First, the conductive contact unit according to the exemplary embodiment has an advantage that the first needle-like member 13 can be easily manufactured. That is, as shown in FIG. 3-1 to 3-5, when the first needle-like member 13 is manufactured, it is only required to perform the process from a single direction (the left side in FIG. 3-1 to FIG. 3-5) with respect to the rod-like body 16 after the rod-like body 16 is once fixed by the gripping member 17. Specifically, in the embodiment, to form the contact member 13b as shown in FIG. 3-4 while the rod-like body 16 is being fixed by the gripping member 17, the process is performed from the left side by the grinding member 21. Similarly, the process is performed from the left side by the drill 20 to form the hole portion 19 to be the through hole 13g.

Therefore, in the embodiment, the first needle-like member 13 can be manufactured without changing the direction of the rod-like body 6 (a member to be processed). As a result, in the conductive contact unit according to the exemplary embodiment, the first needle-like member 13 can be easily manufactured, and the axis deviation can be prevented. Therefore, a high-quality first needle-like member 13 can be easily manufactured.

Figure 8:
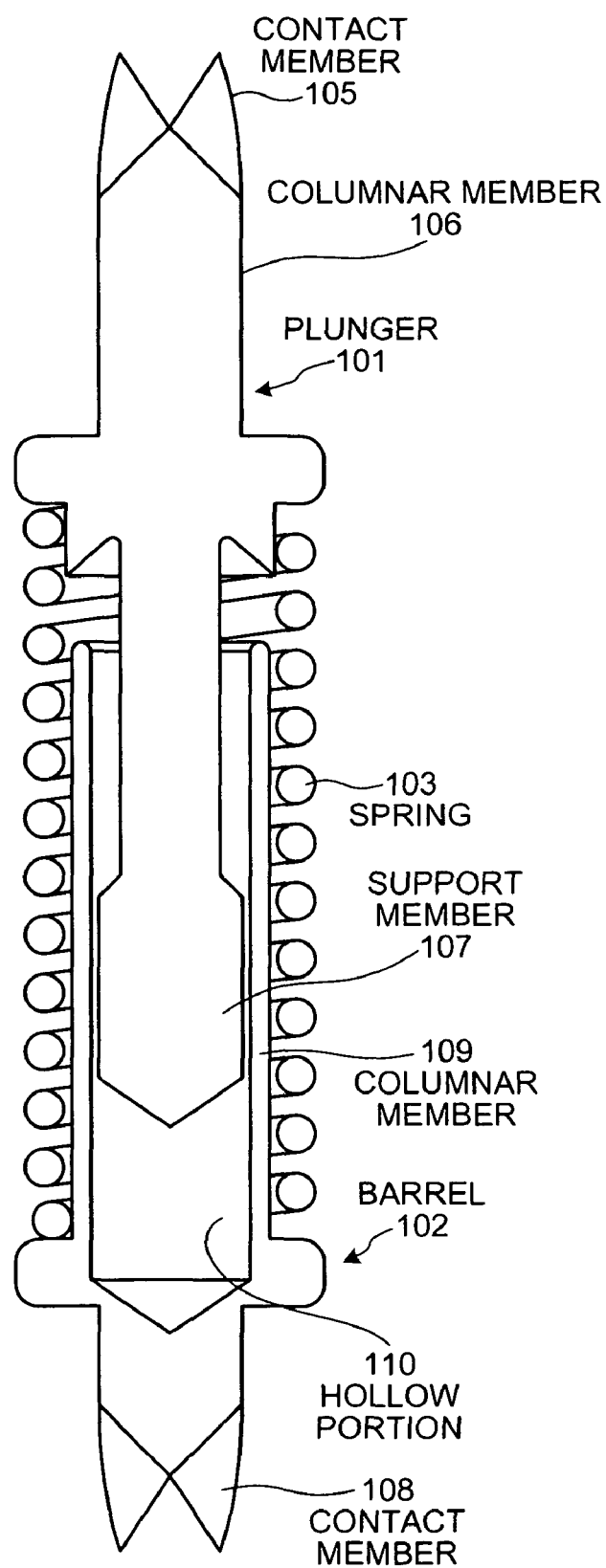
FIG. 8 is a schematic of a configuration of a conventional conductive contact.

The reason why such advantages can be achieved in the exemplary embodiment is that a hole in the first needle-like member 13 for accommodating the support member 14a of the second needle-like member 14 is of a through hole shape having a constant inner diameter. That is, when the hole portion formed in the first needle-like member 13 is formed in a cavity-like shape having the bottom as shown in FIG. 8, the hole portion is required to have an opening end at least on the second needle-like member 14 side, and therefore, the direction of the rod-like body 16 needs to be changed to form the hole portion. On the other hand, in the exemplary embodiment, the first needle-like member 13 has the structure in which the through hole 13g has the opening ends on both ends of the longitudinal direction, and therefore, drilling process in manufacturing with the drill 20 can be performed from the side opposite to the second needle-like member 14. With this structure, the aforementioned advantages can be achieved in the exemplary embodiment.

Further, the exemplary embodiment has other advantages with the structure in which the first needle-like member 13 includes the through hole 13g. That is, the first needle-like member 13 is used with the inner circumference surface of the through hole 13g being in contact with the outer circumference surface of the support member 14a of the second needle-like member 14, and requires less physical slide resistance and electrical contact resistance against the outer circumference surface of the support member 14a. Therefore, the inner circumference surface of the through hole 13g formed in the first needle-like member 13 needs to be smoothed, and surface finishing such as plating or the like is generally applied thereto.

When plating is used as surface finishing of the inner circumference surface of the through hole 13g formed in the first needle-like member 13, the plating can be uniformly applied over the entire inner circumference surface by forming the through hole 13g to have a plurality of opening ends. When the plating is performed, electrolytic plating or non-electrolytic plating is performed while the entire member as shown in FIG. 3-5 is being immersed in a plating liquid. The plating liquid used herein includes a liquid that contains, in a predetermined concentration, a metal ion to be attached to the inner circumference surface of the through hole 13g. On the other hand, for liquid component of the plating liquid near the first needle-like member 13, a contained metal ion attaches to the surface of the first needle-like member 13 with progress of plating. Consequently, the metal ion concentration in the plating liquid component gradually lowers, and the efficiency of plating decreases. Therefore, when actual plating is performed, it is necessary to maintain a state where a fresh plating liquid component (i.e., containing a large number of metal ions) is always in contact with the surface of the first needle-like member 13 by, for example, performing plating while the plating liquid is being circulated.

Whereas, in the case of the conventional structure as shown in FIG. 8, even in a flowing plating liquid, it is difficult to maintain contact with a fresh plating liquid component, especially around the inner surface of the hollow portion 110. That is, the hollow portion 110 shown in FIG. 8 has only a single opening end on the side opposite to the contact member 108, and therefore, it is difficult to cause the fresh plating liquid component to flow into the inside of the hollow portion 110. Consequently, there is a possibility that, for example, the plating is thick near the opening end, and almost no plating takes place near the bottom of the hollow portion 110.

On the other hand, the first needle-like member 13 in the exemplary embodiment has a plurality of the opening ends because the through hole 13g is formed to penetrate the columnar member 13a. With this structure, a flowing plating liquid component flows in from one opening end and flows out from the other opening end, which allows the fresh plating liquid component to smoothly flow around the inner circumference surface of the through hole 13g. Therefore, in the conductive contact unit according to the exemplary embodiment, when the plating is applied to the first needle-like member 13, a fresh plating liquid can be always in contact with the inner circumference surface of the through hole 13g, and plating can be performed uniformly on the entire inner circumference surface.

Besides, as shown in FIG. 2, two opening ends of the first needle-like member 13 are formed on both ends in the longitudinal direction of the through hole 13g, which enables further smooth plating. That is, in the exemplary embodiment, two opening ends of the through hole 13g are formed on both sides in the longitudinal direction of the through hole 13g. As described above, when the plating is performed, a fresh plating liquid flows from one of the two opening ends to the other. Because the two opening ends are formed on both ends in the longitudinal direction, the plating liquid uniformly flows inside the through hole 13g in the longitudinal direction. In other words, the fresh plating liquid flows in substantially the same amount at substantially the same speed, and plating is applied uniformly to the inner circumference surface. Thus, generation of thick plated portion can be suppressed.

FIRST MODIFIED EXAMPLE

Next, a first modified example of a conductive contact unit according to the exemplary embodiment will be described. In the first modified example, an inner diameter of a through hole formed in a first needle-like member forming a conductive contact is monotonically decreasing with distance from a contact member side. The term "Monotonically decreasing" as used herein is synonymous with mathematical meaning and, specifically, it indicates that the through hole is formed so that the inner diameter becomes the same or decreases with distance from near a contact member. More specifically, "the inner diameter of the through hole is monotonically decreasing with distance from the contact member side" indicates a state where the through hole is formed so that the following relationship is formed:

[Equation 1]

$$\frac{d}{dx}f(x) \leq 0 \quad (1)$$

where distance from the contact member is x, and the inner diameter of the through hole at a point of the distance x is f(x).

FIG. 4 is a schematic of the entire configuration of a conductive contact constituting a conductive contact unit according to the first modified example. As shown in FIG. 4, in the first modified example, a spring member 12 and a second needle-like member 14 have the same configuration as those of FIG. 2. Whereas, a first needle-like member 22 is of different configuration from that shown in FIG. 2 in that a through hole 22a is formed in the longitudinal direction near a contact member 13b, a first hole portion 22b having an inner diameter $d_1$ is formed, and a second hole portion 22c having an inner diameter $d_2 (<d_1)$ is formed on the side opposite the contact member 13b with respect to the first hole portion 22b.

A manufacturing process of the first needle-like member 22 with such a configuration will be briefly described. The first needle-like member 22 can be basically manufactured in the same manner as described previously in connection with FIG. 3-1 to FIG. 3-5; however, a process shown in FIG. 5-1 and 5-2 needs to be performed in place of the process shown in FIG. 3-3. FIG. 5-1 and FIG. 5-2 are schematics for explaining the process to form the through hole 22a in the first needle-like member 22 according to the first modified example.

First, as shown in FIG. 5-1, a hole portion 27 with the inner diameter $d_2$ is formed while a rod-like body 24 is being fixed by a gripping member 17. That is, a small bore drill 26 for forming the hole portion with the inner diameter $d_2$ is fixed by a gripping member 25, and is brought into contact with the left end surface of the rod-like body 24 (i.e., the surface where the contact member 13b is to be formed) while being rotated. Then, the small bore drill 26 is moved in the right direction by a predetermined amount. Thus, the hole portion 27 with the inner diameter $d_2$ is formed.

After that, as shown in FIG. 5-2, a hole portion 29 with the inner diameter $d_1$ is formed while the rod-like body 24 is being fixed by the gripping member 17 as in FIG. 5-1. That is, the small bore drill 26 fixed by the gripping member 25 is replaced with a large bore drill 28 for forming the hole portion with the inner diameter $d_1$, and the large bore drill 28 is inserted from the left end surface of the rod-like body 24 by a predetermined distance while being rotated. Thus, the hole portion 29 is formed.

Here, in the process shown in FIG. 5-2, the insertion distance of the large bore drill 28 is set to be shorter than that of the small bore drill 26, and thereby a part of the hole portion 27 formed in the rod-like body 24 remains. Then, the remaining part of the hole portion 27 becomes the first hole portion 22b in the first needle-like member 22; the hole portion 29 formed by the process shown in FIG. 5-2 becomes the second hole portion 22c in the first needle-like member 22.

As described above, the advantages of the present invention can be achieved not only when the through hole is formed to have the same inner diameter, but also when the inner diameter is monotonically decreasing with distance from the contact member 13b side. That is, as shown in FIG. 5-1 and FIG. 5-2, the direction of the rod-like body 24 need not be changed when the hole portion 27 and the hole portion 29 are formed. As in the exemplary embodiment, a high-quality first needle-like member 22 can be easily manufactured. Moreover, as in the exemplary embodiment, the through hole 22a has two opening ends, and therefore, there is an advantage that uniform plating can be achieved.

Further, the conductive contact unit of the first modified example has advantages other than those of the conductive contact unit according to the exemplary embodiment. Such advantage will be described referring to the drawings as required.

Figures 1, 6:
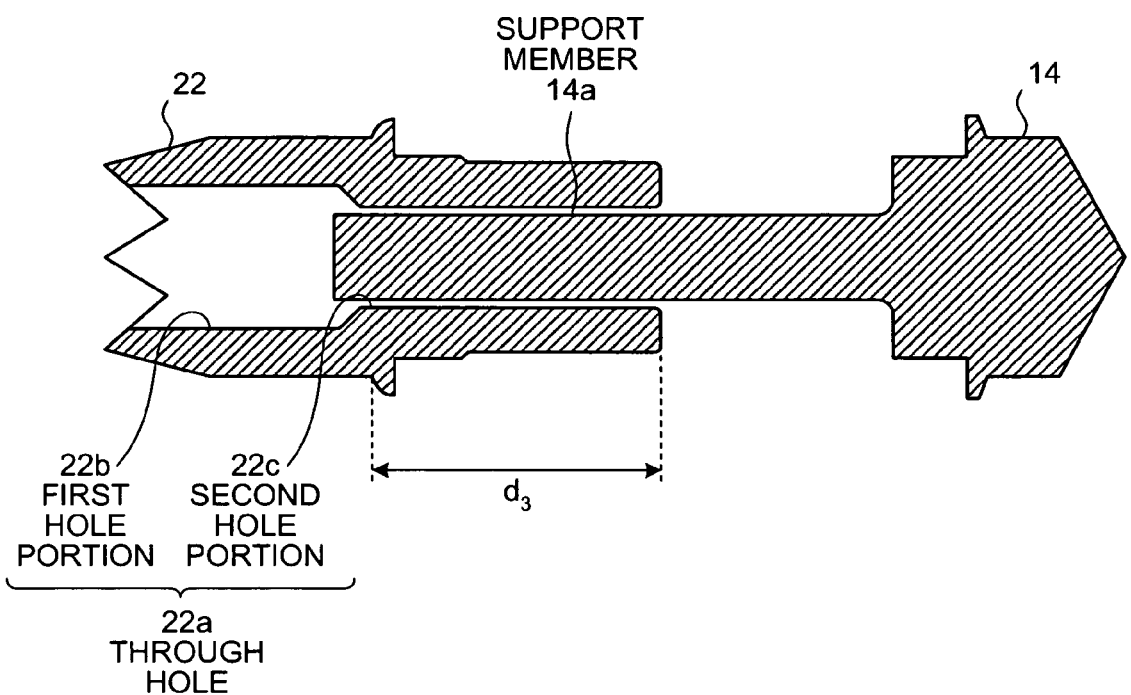
Figures 2, 6:
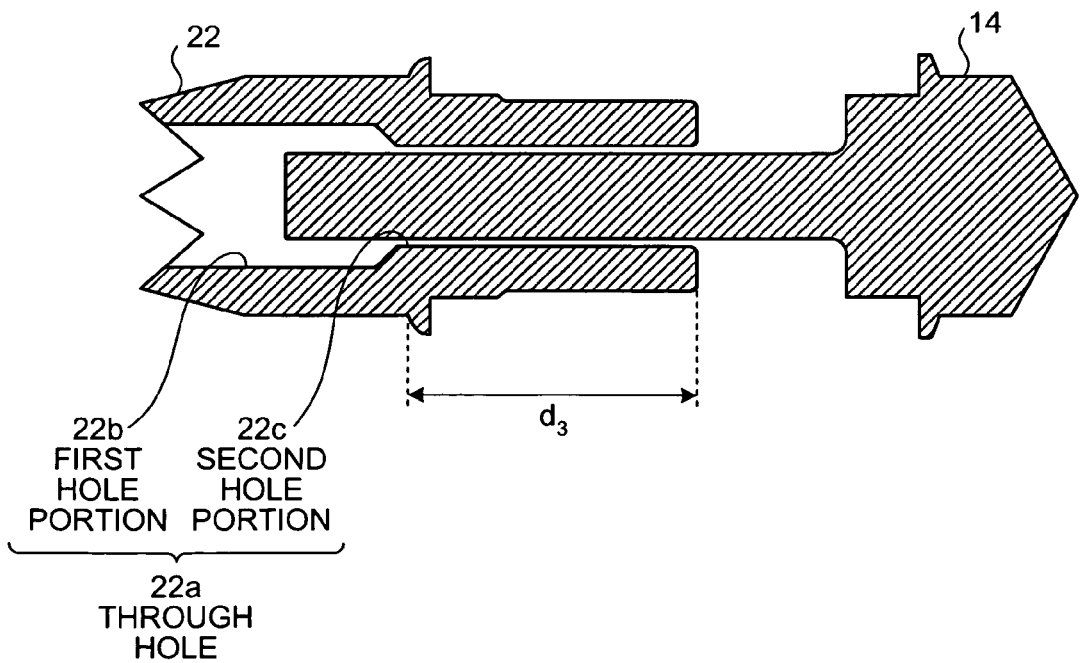

FIG. 6-1 and FIG. 6-2 are schematics for explaining the advantages of the conductive contact according to the first modified example. FIG. 6-1 depicts the conductive contact which is completely extended in the longitudinal direction; FIG. 6-2 depicts the conductive contact which is completely contracted in the longitudinal direction. In FIG. 6-1 and FIG. 6-2, a spring member 12 is not shown in order to facilitate understanding.

In the state shown in FIG. 6-1, in the conductive contact according to the first modified example an outer circumference surface of a support member 14a is in contact with an inner circumference surface of a second hole portion 22c, and is not in contact with an inner circumference surface of a first hole portion 22b. Accordingly, when the conductive contact is completely extended in the longitudinal direction as shown in FIG. 6-1, a region in which the inner circumference surface of the through hole 22a is in contact with the support member 14a has a length of the longitudinal direction of the second hole portion 22c with respect to the longitudinal direction of the conductive contact, that is, a length $d_3$ shown in FIG. 6-1.

Next, as shown in FIG. 6-2, the state where the conductive contact is completely contracted in the longitudinal direction will be discussed. In such a case, as compared with FIG. 6-1, a length in the longitudinal direction of the support member 14a inserted in the through hole 22a lengthens, whereas, because the inner circumference surface of the first hole portion 22b does not come in contact with the outer circumference surface of the support member 14a, a region coming in contact with the inner circumference surface of the through hole 22a has a length of the longitudinal direction of the second hole portion 22c with respect to the longitudinal direction of the conductive contact, that is, the length $d_3$. In other words, in the conductive contact of the first modified example, a contact area between the first needle-like member 22 and the second needle-like member 14 does not change when the conductive contact is extended and contracted.

As already described, in the conductive contacts according to the exemplary embodiment and the first modified example, the outer circumference surface of the support member 14a in the second needle-like member 14 is in contact with the inner circumference surface of the through hole formed in the first needle-like member to ensure electrical conductivity between the first needle-like member and the second needle-like member 14. Accordingly, an electrical contact resistance between both the members changes depending on a contact area between the outer circumference surface of the support member 14a and the inner circumference surface of the through hole.

In the first modified example, as shown in FIG. 6-1 and FIG. 6-2, the contact area does not change when the conductive contact is extended and contracted. Therefore, with the conductive contact in the first modified example, electrical contact resistance between the first needle-like member 22 and the second needle-like member 14 can be maintained constant regardless of variations in length of the conductive contact in the longitudinal direction during use.

Further, slide resistance generated between the first needle-like member 22 and the second needle-like member 14 when the conductive contact is extended and contracted is also determined depending on the contact area between the first needle-like member 22 and the second needle-like member 14, as in the case of the electrical contact resistance. Therefore, the conductive contact in the first modified example has an advantage that the slide resistance generated when the conductive contact is extended and contracted can be maintained constant regardless of the longitudinal direction length of the conductive contact.

Furthermore, the conductive contact in the modified example includes the first hole portion 22b with the inner diameter $d_1$, which prevents foreign substances from entering between the inner circumference surface of the second hole portion 22c and the outer circumference surface of the support member 14a. That is, as shown in FIG. 1, the conductive contact unit is used in a state arranged vertically down the semiconductor integrated circuit 1 to be inspected. Accordingly, in the conventional conductive contact unit, foreign substances such as dust or the like adhered to the semiconductor integrated circuit 1 are gradually accumulated in the conductive contact, and there is a possibility of exerting adverse effects on the contraction and extension movement of the conductive contact.

However, in the conductive contact in the modified example, the first hole portion 22b having a larger inner diameter than that of the second hole portion 22c is formed at a vertically upper portion. With this structure, foreign substances from outside are accumulated in the first hole portion 22b, for example, in the vicinity of a boundary with the second hole portion 22c. Thus, it is possible to prevent foreign substances from entering between the inner circumference surface of the second hole portion 22c and the outer circumference surface of the support member 14a.

In addition, the through hole 22a formed in the first needle-like member 22 in the first modified example is not limited to the one shown in FIG. 4. That is, examples of the first needle-like member 22 in the first modified example include all those having a through hole with an inner diameter that monotonically decreases with distance from a contact member, i.e., that changes to satisfy the relationship of Equation 1. Therefore, a through hole in, for example, a tapered shape can be used whose inner diameter decreases at a constant rate with distance from a contact member.

SECOND MODIFIED EXAMPLE

Figure 7:
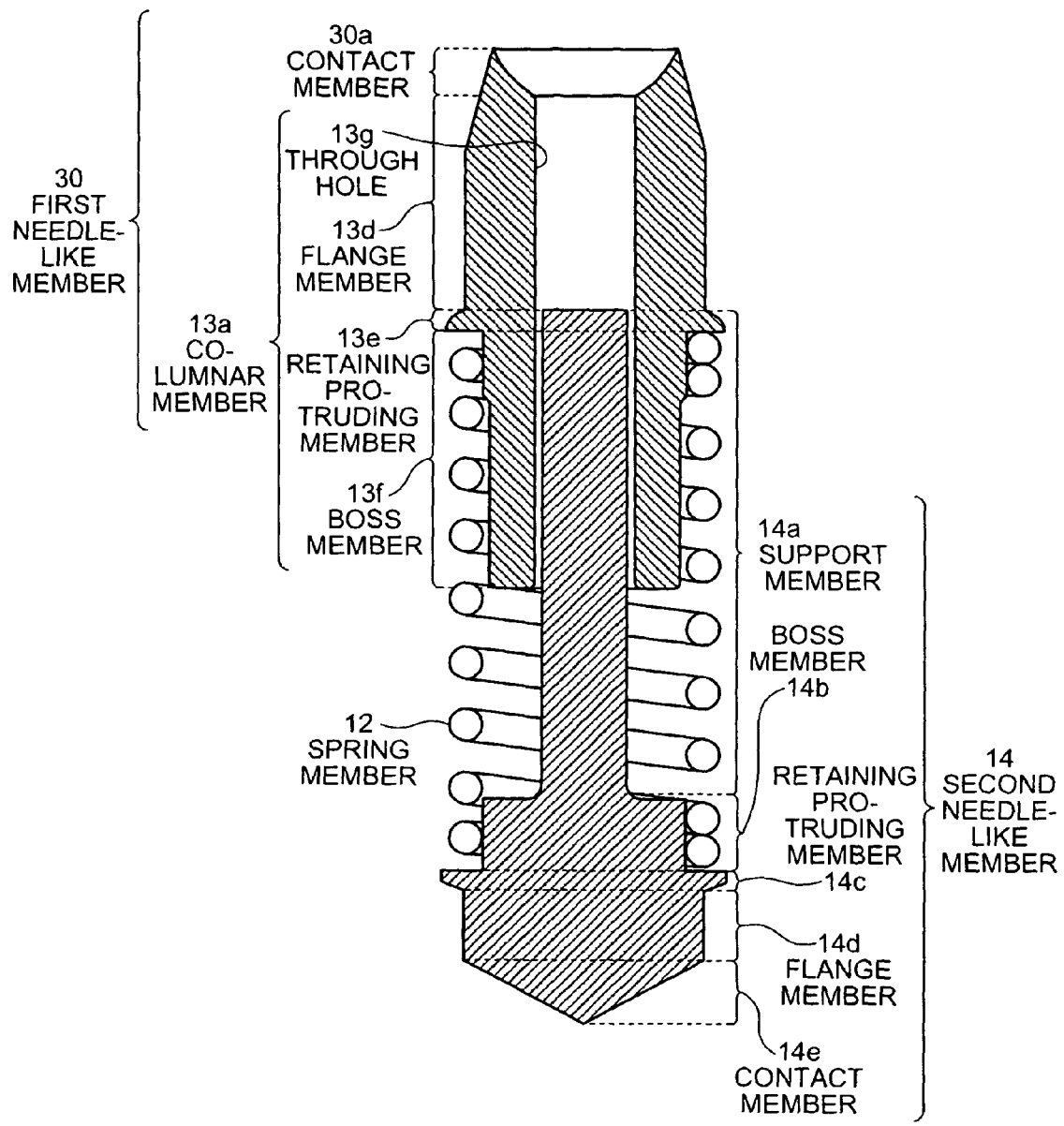
FIG. 7 is a sectional view of a configuration of a conductive contact constituting a conductive contact unit according to a second modified example.

Next, a conductive contact unit according to a second modified example will be described. The second modified example is characterized by the shape of a contact member formed in a first needle-like member constituting a conductive contact. FIG. 7 is a schematic of the entire configuration of the conductive contact in the second modified example. As shown in FIG. 7, the conductive contact in the second modified example is basically similar in structure to that of the conductive contact 5 shown in FIG. 2 except that a contact member 30a formed in a first needle-like member 30 has a shape different from the one having a plurality of the sharp-pointed portions.

Specifically, as shown in FIG. 7, the contact member 30a has a shape having a spherical or paraboloid-concave surface, that is, a bowl-like shape. Even when the contact member 30a has such a shape, it is possible to electrically connect the contact member 30a to the vicinity of the peripheral portion of the connecting electrode 8 in the semiconductor integrated circuit 1.

In addition, in the conductive contact shown in FIG. 7, the through hole 13g formed in the first needle-like member has a constant inner diameter as in the embodiment. However, it is not so limited, and, as in the first modified example, the through hole can include a plurality of hole portions having different inner diameters.

Further, in the structure of the embodiment and the first and second modified examples, the first needle-like member is arranged on the side of the body to be contacted (the semiconductor integrated circuit 1), and the second needle-like member is arranged on the side of the circuit board 2; however, it is not limited to such a structure. That is, the conductive contacts shown in FIG. 2, FIG. 4, and FIG. 7 can be accommodated in the holder hole 3 with the first needle-like member being arranged on the circuit board 2 side and the second needle-like member being arranged on the side of the body to be contacted. With such a structure, it is obviously possible to achieve the advantages of the present invention.

As described above, the needle-like member, the conductive contact, and the conductive contact unit according to the present invention are useful for realizing electrical contact with connecting electrodes of a semiconductor integrated circuit on inspection of, for example, electrical characteristics of the semiconductor integrated circuit and, more particularly, useful for realizing a needle-like member or the like which can be manufactured in a simple manner.

The invention claimed is:

1. A needle-like member that constitutes a conductive contact which electrically connects a first object to a second object, the needle-like member comprising:
   a columnar member having
      a first end and a second end;
      a through hole extending entirely through the columnar member from the first end to the second end to form openings in said first end and in said second end;
      a contact member integrally formed on the first end of the columnar member and configured to electrically contact with the first object; and
   a spring member that surrounds an outer surface of the columnar member and applies an elastic force on an other needle-like member present in the through hole,
   wherein the through hole has hole portions with different inner diameters, and
   wherein one hole portion has such an inner diameter and a length that an electrical contact resistance can be maintained constant between the one hole portion and the other needle-like member, and inner diameters of other hole portions are larger than the inner diameter of the one hole portion.

2. The needle-like member according to claim 1, wherein the second object is a circuit that generates and transmits an electrical signal to be supplied to the first object.

3. The needle-like member according to claim 1, wherein the second object is a circuit board that includes a circuit for generating and transmitting an electrical signal to be supplied to the first object.

4. The needle-like member according to claim 1, wherein the contact member is located near a periphery of the columnar member in a longitudinal direction to come in contact with a periphery of a connecting electrode of the first object.

5. A conductive contact that electrically connects a first object to a second object, the conductive contact comprising:
   a first needle-like member that included a columnar member having
      a first end and a second end;
      a through hole extending entirely through the columnar member from the first end to the second end to form openings in said first end and in said second end; and
      a contact member configured to electrically contact with the first object and arranged at the first end; and
   a second needle-like member that is arranged to electrically connect to the first needle-like member, and including a support member having a sliding portion that is slidable in the longitudinal direction while being in contact with an inner surface of the through hole; and
   a spring member that is fixed to the first needle-like member and surrounds an outer surface of the columnar member, and applies an elastic force on the second needle-like member present in the through hole,
   wherein the through hole has hole portions with different inner diameters, and
   wherein one hole portion has such an inner diameter and a length that an electrical contact resistance can be maintained constant between the one hole portion and the second needle-like member, and inner diameters of other hole portions are larger than the inner diameter of the one hole portion.

6. The conductive contact according to claim 5, wherein the second object is a circuit that generates and transmits an electrical signal to be supplied to the first object.

7. The conductive contact according to claim 5, wherein the second object is a circuit board that includes a circuit for generating and transmitting an electrical signal to be supplied to the first object.

8. The conductive contact according to claim 5, wherein the second needle-like member also includes
a contact member that is integrally formed with the support member, and configured to electrically contact with the second object.

9. A conductive contact unit comprising:
a conductive contact which electrically connects a first object to a second object, including
a needle-like member that includes a columnar member having a first end and a second end, a through hole extending entirely through the columnar member from the first end to the second end to form openings in said first end and in said second end, and a contact member configured to electrically contact with an object; and
a spring member surrounding an outer surface of the columnar member that biases the needle-like member in a direction perpendicular to the object; and
a conductive contact holder that includes a holder hole for accommodating the conductive contact,
wherein the through hole has hole portions with different inner diameters, and
wherein one hole portion has such an inner diameter and a length that an electrical contact resistance can be maintained constant between the first object and the second obiect, and inner diameters of other hole portions are larger than the inner diameter of the one hole portion.

10. The conductive contact unit according to claim 9, further comprising a circuit that generates and transmits an electrical signal to be supplied to the object.

11. The conductive contact unit according to claim 9, further comprising a circuit board that includes a circuit for generating and transmitting an electrical signal to be supplied to the object.

12. A needle-like member that constitutes a conductive contact which electrically connects a first object to a second object, the needle-like member comprising:
a columnar member having a first end and a second end, and a through hole that extends entirely through the columnar member from the first end to the second end to form openings in said first end and in said second end; and
a contact member integrally formed on the first end of the columnar member and configured to electrically contact with the first object,
wherein the through hole has hole portions with different inner diameters, and
wherein one hole portion has such an inner diameter and a length that an electrical contact resistance can be maintained constant between the first object and the second object, and inner diameters of other hole portions are larger than the inner diameter of the hone hole portion.

13. The needle-like member according to claim 12, wherein the second object is a circuit that generates and transmits an electrical signal to be supplied to the first object.

14. The needle-like member according to claim 12, wherein the second object is a circuit board that includes a circuit for generating and transmitting an electrical signal to be supplied to the first object.

15. The needle-like member according to claim 12, wherein the contact member is located near a periphery of the columnar member in a longitudinal direction to came in contact with a periphery of a connecting electrode of the first object.

* * * * *